(12) United States Patent
Chang

(10) Patent No.: US 8,710,867 B1
(45) Date of Patent: Apr. 29, 2014

(54) ELECTRONIC SYSTEM AUTO-MUTE CONTROL CIRCUIT AND CONTROL METHOD THEREOF

(71) Applicant: Anpec Electronics Corporation, Hsinchu (TW)

(72) Inventor: Ming-Huang Chang, Hsinchu County (TW)

(73) Assignee: Anpec Electronics Corporation, Hsinchu (TW)

(*) Notice: Subject to any disclaimer, the term of this patent is extended or adjusted under 35 U.S.C. 154(b) by 0 days.

(21) Appl. No.: 13/778,363

(22) Filed: Feb. 27, 2013

(30) Foreign Application Priority Data

Dec. 7, 2012 (TW) ............................ 101146153 A

(51) Int. Cl.
| | |
|---|---|
| *G01R 19/00* | (2006.01) |
| *G11C 7/00* | (2006.01) |
| *H03F 3/45* | (2006.01) |
| *H03K 5/24* | (2006.01) |
| *H03K 5/1532* | (2006.01) |
| *G11C 7/06* | (2006.01) |

(52) U.S. Cl.
CPC .............. *H03K 5/24* (2013.01); *H03K 5/1532* (2013.01); *G11C 7/06* (2013.01); *G11C 7/062* (2013.01)

USPC .................. 327/54; 327/51; 327/56; 327/306; 327/307

(58) Field of Classification Search
CPC ......... H03K 5/24; H03K 5/1532; G11C 7/06; G11C 7/062
USPC ................................ 327/51, 54, 56, 306, 307
See application file for complete search history.

(56) References Cited

U.S. PATENT DOCUMENTS 7,282,965 B2 * 10/2007 Hatooka et al. .................. 327/80
8,026,743 B2 *  9/2011 Ou ..................................... 327/62

* cited by examiner

*Primary Examiner* — John Poos
(74) *Attorney, Agent, or Firm* — Rosenberg, Klein & Lee

(57) ABSTRACT

An auto-mute control circuit is disclosed. The auto-mute control circuit includes an analog amplifier, a detecting circuit and a direct-current (DC) level adjusting circuit. The analog amplifier receives an input signal and outputs a sensing voltage signal accordingly. The detecting circuit compares a common-mode voltage received with the sensing voltage signal received and outputs a comparison signal accordingly. The DC adjusting circuit receives the comparison signal and outputs an Up-Down digital signal, a fine tune digital signal and a rough tune digital signal, so that a sensing DC level is equal to the common-mode voltage.

15 Claims, 8 Drawing Sheets

ELECTRONIC SYSTEM AUTO-MUTE CONTROL CIRCUIT AND CONTROL METHOD THEREOF

BACKGROUND OF THE DISCLOSURE

1. Field of the Disclosure

The instant disclosure relates to an auto-mute control circuit; in particular, to an auto-mute control circuit applied into an analog input amplifier.

2. Description of Related Art

A concept of auto-mute is broadly used in reducing noise of a data converter when all of inputs are zero during a data converting process, and a Digital-to-Analog Converter (DAC) is one of examples. During a process of a digital signal being converted into an analog signal, there are some techniques, such as a Dithering, to improve a quantization error. However, when there is no input signal, the Dithering causes the DAC outputting the noise. There are many automatic mute technology practiced in digital way, and it becomes easier to determine what is the so-called "zero-input" because signals are quantized and digitized.

However, there is still a need of auto mute for the analog input amplifier to further reduce the noise outputted. In an analog circuit, a key to make an auto mute function work is how to detect the so called "zero-input." The "zero-input" in the analog circuit field indicates that an input signal is lower than a level for a specific amount and thus it is omitted and seen as the "zero-input." Therefore, in the analog circuit field, a possible challenge is how to detect a very small amplitude signal.

SUMMARY OF THE DISCLOSURE

The instant disclosure provides an auto-mute control circuit, and the auto-mute control circuit includes an analog amplifier, a detecting circuit, and a direct-current (DC) level adjusting circuit. The analog amplifier receives an input signal and outputs a sensing voltage signal accordingly. The detecting circuit is coupled to the analog amplifier, and the detecting circuit compares a common-mode voltage received with the sensing voltage signal received and outputs a comparison signal according to a comparing result. The DC adjusting circuit receives the comparison signal and accordingly outputs an Up-Down digital signal, a fine tune digital signal and a rough tune digital signal to the analog amplifier to adjust a sensing DC level of the sensing voltage signal, so that the sensing DC level is close to or equal to the common-mode voltage, wherein initial values of the fine tune digital signal and the rough tune digital signal are both "zero." When the sensing DC level unadjusted is lower than the common-mode voltage, the DC level adjusting circuit sets a total bit values of the fine tune digital signal as "one" and outputs the Up-Down digital signal of a high level voltage to the analog amplifier to increase the sensing DC level. When the sensing DC level unadjusted is higher than the common-mode voltage, the DC level adjusting circuit sets the total bit values of the fine tune digital signal as "one" and outputs the Up-Down digital signal of a low level voltage to the analog amplifier to decrease the sensing DC level.

In an embodiment of the instant disclosure, wherein after setting the total bit values of the fine tune digital signal as "one," if there is a first cross point generated between the sensing DC level and the common-mode voltage, the DC level adjusting circuit gradually reduces the fine tune digital signal value from maximum toward minimum once a least significant bit (LSB) until a second cross point between the sensing DC level and the common-mode voltage encountered; if the first cross point has not been generated between the sensing DC level and the common-mode voltage, then the DC level adjusting circuit gradually increases the rough tune digital signal value from minimum toward maximum once a least significant bit (LSB) until a first cross point between the sensing DC level and the common-mode voltage encountered.

In an embodiment of the instant disclosure, wherein during a gradually adjusting process, the DC level adjusting circuit determines if the total bit values of the fine tune digital signal are "zero," if the total bit values of the fine tune digital signal have all been "zero," then the DC level adjusting circuit ends a DC level calibration work.

In an embodiment of the instant disclosure, wherein if the total bit values of the fine tune digital signal have not been "zero," then the DC level adjusting circuit determines if there is a second cross point generated, and if the DC level adjusting circuit determines that there is the second cross point generated between the sensing DC level and the common-mode voltage, then the DC level adjusting circuit ends the DC level calibration work.

In an embodiment of the instant disclosure, during the process of roughly adjusting the sensing DC level, the DC level adjusting circuit determines if the total bit values of the rough tune digital signal are "one," if the total bit values of the rough tune digital signal is "one," then the DC level adjusting circuit ends the DC level calibration work.

In an embodiment of the instant disclosure, if the total bit values of the rough tune digital signal has not been "one," then the DC level adjusting circuit determines if there is the second cross point generated between the sensing DC level and the common-mode voltage. If there is the second cross point generated between the sensing DC level and the common-mode voltage, then the DC level adjusting circuit ends the DC level calibration work.

In an embodiment of the instant disclosure, the auto-mute control circuit further includes a counter. The counter is coupled to the detecting circuit, and the counter receives the comparison signal and accordingly outputs the auto-mute enabling signal to a first switch and a signal processing unit, wherein when the comparison signal is a low level voltage, the counter starts counting, and when the comparison signal is a high level voltage, the counter will be reset, wherein when the counter counts until a predetermined value, the auto-mute enabling signal of a high level voltage is outputted to cut off the first switch and switch off the signal processing unit.

In an embodiment of the instant disclosure, when an amplitude swing of the sensing voltage signal is between an upper-bound voltage and a lower-bound voltage, the detecting circuit outputs the comparison signal of a low level voltage, wherein the upper-bound voltage is a sum of the common-mode voltage and an auto-mute reference voltage; the lower-bound voltage is the common-mode voltage minus the auto-mute reference voltage.

An embodiment of the instant disclosure provides an electronic system, and the electronic system includes an auto-mute control circuit, a first switch, a signal processing unit, a threshold voltage generator, and a load. A terminal of the first switch receives an auto-mute enabling signal and accordingly determines to be switched on or off. The signal processing unit is coupled to another terminal of the first switch and the auto-mute control circuit, and the signal processing unit receives the auto-mute enabling signal and accordingly determines to be switched on or off. The threshold voltage generator is coupled to the auto-mute control circuit, and the threshold voltage generator receives the common-mode voltage and the auto-mute reference voltage, and accordingly generates and transmits the upper-bound voltage and the lower-bound voltage to the auto-mute control circuit. The load is coupled to the signal processing unit, and the load receives the output signal transmitted from the signal processing unit.

In an embodiment of the instant disclosure, the signal processing unit includes a first resistor, an operation amplifier, a second resistor, and a second switch. A terminal of the first resistor is coupled to another terminal of the first switch. A negative input terminal of the operation amplifier is coupled to another terminal of the first resistor, and a positive input terminal of the operation amplifier receives the common-mode voltage, and an output terminal of the operation amplifier outputs an output signal. A terminal of the second resistor is coupled to another terminal of the first resistor, and a second terminal of the second resistor is coupled to the output terminal of the operation amplifier. The second switch is coupled to the second resistor in parallel, wherein the second switch receives the auto-mute enabling signal and accordingly determines to be switched on or off, wherein states of being switched on or off for the first switch and the second switch are opposite.

An embodiment of the instant disclosure provides an auto-mute control method, and the auto-mute control method is for an auto-mute control circuit or an electronic system with the auto-mute control circuit, and the auto-mute control method include steps as follows: acquiring a sensing DC level of a sensing voltage signal; determining if the sensing DC level is higher than the common-mode voltage; calibrating the sensing DC level and setting a total bit values of a fine tune digital signal as "one" if the sensing DC level is higher or lower than the common-mode voltage; determining if there is a first cross point generated; gradually decreasing the fine tune digital signal if there is the first cross point generated; determining if the total bit values of the fine tune digital signal are "zero"; determining if there is a second cross point generated if the total bit values have not been "zero"; setting an upper-bound voltage and a lower-bound voltage if there is the second cross point generated; and ending a DC level calibration work.

To sum up, the electronic system, the auto-mute control circuit and the control method thereof in the embodiments of the instant disclosure allow an electronic system to enter the "DC level calibration mode" after starting up, and adjust the sensing DC level of the sensing voltage signal to be close to or equal to the common-mode voltage. Afterwards, the auto-mute control circuit enters the "auto-mute detecting mode," in which is to start an auto-mute function through detecting an amplitude swing of the sensing voltage. Accordingly, the instant disclosure is able to automatically calibrate the sensing DC level to have the sensing DC level be close to or equal to the common-mode voltage, and further allows a noise to be reduced when there is zero input and a signal-to-noise ratio to be raised for the electronic system with the auto-mute control circuit.

For further understanding of the instant disclosure, reference is made to the following detailed description illustrating the embodiments and examples of the instant disclosure. The description is only for illustrating the instant disclosure, not for limiting the scope of the claim.

BRIEF DESCRIPTION OF THE DRAWINGS

The description as recited below refers to accompanying drawings for a detailed instruction and thus the instant disclosure is further understood, and in the accompanying drawings:

FIGS. 6A-1, 6A-2 and 6B show a flow chart of an auto-mute control method according to the embodiment of the instant disclosure;

DETAILED DESCRIPTION OF PREFERRED EMBODIMENTS

Figure 1:
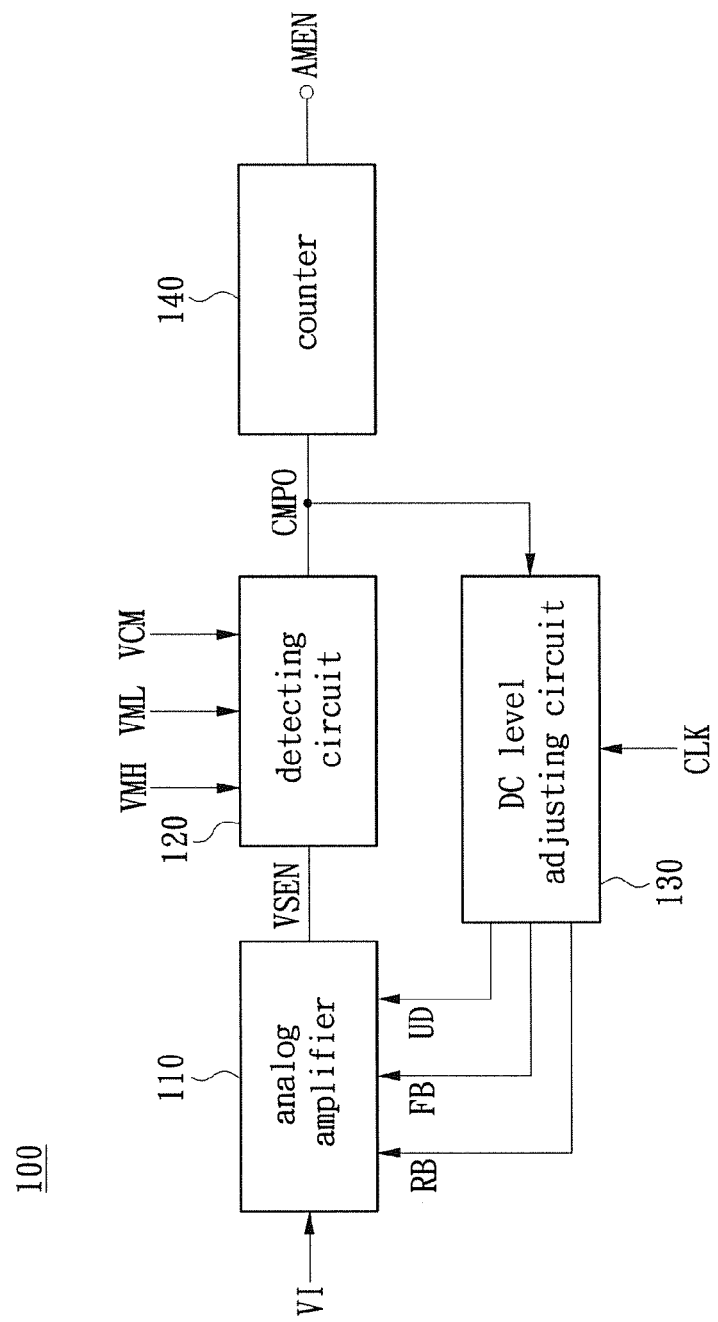
FIG. 1 shows a block diagram of an auto-mute control circuit according to an embodiment of the instant disclosure.

The aforementioned illustrations and following detailed descriptions are exemplary for the purpose of further explaining the scope of the instant disclosure. Other objectives and advantages related to the instant disclosure will be illustrated in the subsequent descriptions and appended drawings. In the drawings, the size and relative sizes of layers and regions may be exaggerated for clarity.

It will be understood that, although the terms first, second, third, and the like, may be used herein to describe various elements, components, regions, layers and/or sections, these elements, components, regions, layers and/or sections should not be limited by these terms. These terms are only to distinguish one element, component, region, layer or section from another region, layer or section discussed below could be termed a second element, component, region, layer or section without departing from the teachings of the instant disclosure. As used herein, the term "and/or" includes any and all combinations of one or more of the associated listed items.

[Embodiment of a DC Level Calibration Mode for an Auto-Mute Control Circuit]

Referring to FIG. 1, FIG. 1 shows a block diagram of an auto-mute control circuit 100 according to an embodiment of the instant disclosure. The auto-mute control circuit 100 includes an analog amplifier 110, a detecting circuit 120, a direct-current (DC) level adjusting circuit 130, and a counter 140. The detecting circuit 120 is coupled to the analog amplifier 110, and the DC level adjusting circuit 130 is coupled between the detecting circuit 120 and the analog amplifier 110. The counter 140 is coupled to the detecting circuit 120. In the present embodiment, the auto-mute control circuit 100 first enters a "DC level calibration mode," which means, the auto-mute control circuit 100 automatically adjusts a sensing DC level of a sensing voltage signal VSEN to have the sensing DC level of the sensing voltage signal VSEN close to or equal to a common-mode voltage VCM, wherein the sensing voltage signal VSEN is an input signal VI amplified, and the common-mode voltage VCM is a common-mode DC voltage level inside a system. After finishing a DC level calibration work, the auto-mute control circuit 100 enters an "auto-mute detecting mode," and sets an upper-bound voltage and a lower-bound voltage to detect the sensing voltage signal VSEN, and when a swing range of the amplitude of the sensing voltage signal VSEN is between the upper-bound voltage and the lower-bound voltage for a predetermined time, the auto-mute control circuit 100 generates an auto-mute enabling signal AMEN to other circuit blocks to reduce a noise.

Regarding the analog amplifier 110, the analog amplifier 110 has a gain (adjustable through a resistor value inside), and the analog amplifier 110 amplifies the input signal VI received and outputs the sensing voltage signal VSEN accordingly. Furthermore, the analog amplifier 110 further receives an Up-Down digital signal UD, a fine tune digital signal FB, and a rough tune digital signal RB and adjusts the sensing DC level of the sensing voltage signal VSEN accordingly. It is worth mentioning that the instant disclosure amplifies the input signal VI with the analog amplifier 110 to detect an input signal with small amplitude.

Regarding the detecting circuit 120, the detecting circuit 120 receives the common-mode voltage VCM and the sensing voltage signal VSEN and compares the common-mode voltage VCM with the sensing voltage level of the sensing voltage signal VSEN, and the detecting circuit 120 outputs a comparison signal CMPO according to a comparing result.

Regarding the DC level adjusting circuit 130, the DC level adjusting circuit 130 receives the comparison signal CMPO and a clock signal CLK, and according to the comparison signal CMPO, the DC level adjusting circuit 130 transmits the Up-Down digital signal UD, the fine tune digital signal FB, and the rough tune digital signal RB to the analog amplifier 110 to adjust the sensing DC level of the sensing voltage signal VSEN, and thereby the sensing DC level is able to be close to or equal to the common-mode voltage VCM. Among which, in the embodiment, initial values of the fine tune digital signal FB and the rough tune digital signal RB are both zero, which means, total bit values of the fine tune digital signal FB and the rough tune digital signal RB are both "zero;" however, a designer may further set according to a counting mechanism, and thus it is not limited thereto. When an initial sensing DC level is lower than the common-mode voltage VCM, the DC level adjusting circuit 130 sets the total bit values of the fine tune digital signal FB as "one" and outputs the Up-Down digital signal UD of a high level voltage (digital logic: "one") to the analog amplifier 110 to adjust the sensing DC level higher; when the initial sensing DC level is higher than the common-mode voltage, the DC level adjusting circuit 130 sets the total bit values of the fine tune digital signal FB as "one" and outputs the Up-Down digital signal UD of a low level voltage (digital logic: "zero") to the analog amplifier 110 to decrease the sensing DC level.

Regarding the counter 140, the counter 140 receives the comparison signal CMPO and accordingly outputs the auto-mute enabling signal AMEN to a first switch (not shown in FIG. 1) and a signal processing unit (not shown in FIG. 1), wherein when the comparison signal CMPO is a low level voltage, the counter 140 starts counting, and when the comparison signal CMPO is a high level voltage, the counter 140 will be reset, wherein when the counter 140 counts until a predetermined value, the auto-mute enabling signal AMEN of a high level voltage is outputted to cut off the first switch and switch off the signal processing unit.

There is further instruction in teaching an operation mechanism of the auto-mute control circuit 100. The content of the instant disclosure is teaching from the "DC level calibration mode" to the "auto-mute detecting mode". In the following description is instruction for a DC level adjusting mechanism and which is a part of the "DC level calibration mode."

When an electronic system starts up, the auto-mute control circuit 100 first enters the "DC level calibration mode". The analog amplifier 110 amplifies the input signal VI received and outputs the sensing voltage signal VSEN to the detecting circuit 120. The detecting circuit 120 detects the sensing voltage signal VSEN received and acquires the sensing DC level of the sensing voltage signal VSEN, and compares the sensing DC level of the sensing voltage signal VSEN with the common-mode voltage VCM, and the detecting circuit 120 outputs a comparison signal CMPO to the DC level adjusting circuit 130 according to the comparing result. In addition, in the present embodiment, if the comparison signal CMPO is a high level voltage (i.e. digital logic: "one"), and then it indicates that the sensing DC level of the sensing voltage signal VSEN is higher than the common-mode voltage VCM; if the comparison signal CMPO is a low level voltage (i.e. digital logic: "zero"), and then it indicates that the sensing DC level of the sensing voltage signal VSEN is lower than the common-mode voltage VCM.

If an initial comparison signal CMPO is the digital logic of "zero," which means, if the DC level adjusting circuit 130 determines that the sensing DC level of the sensing voltage signal VSEN is lower than the common-mode voltage VCM according to the comparison signal CMPO, the DC level adjusting circuit 130 first sets the total bit values of the fine tune digital signal FB as "one" and outputs the Up-Down digital signal UD of the high level voltage to the analog amplifier 110 to adjust the sensing DC level of the sensing voltage signal VSEN higher. It is worth mentioning that an effect of setting the total bit values of the fine tune digital signal FB from the digital logic of "zero" to "one" is equivalent to increase a Least Significant Bit (LSB) of the rough tune digital signal RB. Afterwards, according to the comparison signal CMPO, again, the DC level adjusting circuit 130 determines if there is a first cross point generated between the sensing DC level of the sensing voltage signal VSEN and the common-mode voltage VCM; which is to determine if the sensing DC level of the sensing voltage signal VSEN becomes higher than the common-mode voltage VCM from being lower than the common-mode voltage VCM.

If there is the first cross point generated between the sensing DC level of the sensing voltage signal VSEN and the common-mode voltage VCM; which means the sensing DC level of the sensing voltage signal VSEN becomes higher than the common-mode voltage VCM from being lower than the common-mode voltage VCM, the DC level adjusting circuit 130 gradually decreases the LSB of the fine tune digital signal FB, and transmits the fine tune digital signal FB to the analog amplifier 110 to gradually adjusts (it is to reduce here) the sensing DC level of the sensing voltage signal VSEN. During a process of gradually reducing the sensing DC level of the sensing voltage signal VSEN, the DC level adjusting circuit 130 determines if the total bit values of the fine tune digital signal FB are "zero."

During the process of continuously gradually reducing the sensing DC level of the sensing voltage signal VSEN, when the DC level adjusting circuit 130 determines the total bit values of the fine tune digital signal FB are "zero"; which means the sensing DC level of the sensing voltage signal VSEN is getting very close to the common-mode voltage VCM, and thus the auto-mute control circuit 100 ends the DC level calibration work, sets the upper-bound voltage and the lower-bound voltage, and enters the "auto-mute detecting mode." On the other hand, during the process of continuously gradually reducing the sensing DC level of the sensing voltage signal VSEN, when the DC level adjusting circuit 130 determines the total bit values of the fine tune digital signal FB are not "zero," and then the DC level adjusting circuit 130 further determines whether there is a second cross point generated between the sensing DC level of the sensing voltage signal VSEN and the common-mode voltage VCM; which is to determine if the sensing DC level of the sensing voltage signal VSEN becomes lower than the common-mode voltage VCM again.

If the DC level adjusting circuit 130 determines there is the second cross point generated between the sensing DC level of the sensing voltage signal VSEN and the common-mode voltage VCM; which means that the sensing DC level of the sensing voltage signal VSEN becomes lower than the common-mode voltage VCM again, and which indicates that the sensing DC level of the sensing voltage signal VSEN is getting very close to the common-mode voltage VCM, and the auto-mute control circuit 100 will respectively record values of the rough tune digital signal RB and the fine tune digital signal FB, end the DC level calibration work, set the upper-bound voltage and the lower-bound voltage, and then enter the "auto-mute detecting mode."

On the other hand, when the total bit values of the fine tune digital signal FB are set from the digital logic "zero" to the digital logic "one," if the sensing voltage signal VSEN is still lower than the common-mode voltage VCM, and then it shows that the first cross point between the sensing DC level of the sensing voltage signal VSEN and the common-mode voltage VCM has not been generated, and thus the DC level adjusting circuit 130 gradually increase the LSB of the rough tune digital signal RB, and transmits the rough tune digital signal RB to the analog amplifier 110 to gradually adjusts (it is to raise here) the sensing DC level of the sensing voltage signal VSEN. During a process of gradually raising the sensing DC level of the sensing voltage signal VSEN, the DC level adjusting circuit 130 determines if the total bit values of the rough tune digital signal RB are "one."

During a process of gradually raising the sensing DC level of the sensing voltage signal VSEN, if the DC level adjusting circuit 130 determines if the total bit values of the rough tune digital signal RB are "one," and then it shows that there has not been any cross point generated between the sensing DC level of the sensing voltage signal VSEN and the common-mode voltage VCM, and which means an offset between the sensing DC level of the sensing voltage signal VSEN and the common-mode voltage is too much. At the moment, the auto-mute control circuit 100 ends the DC level calibration work, sets the upper-bound voltage and the lower-bound voltage, and enters the "auto-mute detecting mode."

During a process of gradually increasing the LSB of the rough tune digital signal RB to raise the sensing DC level of the sensing voltage signal VSEN and generates the first cross point; which means that the sensing DC level of the sensing voltage signal VSEN becomes higher than the common-mode voltage VCM from being lower than the common-mode voltage VCM, and then the rough tune digital signal RB will be locked at a value of the moment, and then the DC level adjusting circuit 130 starts gradually decreases the LSB of the fine tune digital signal FB so that the sensing DC level of the sensing voltage signal VSEN is decreased until being lower than the common-mode voltage VCM again; which means that the second cross point is generated. Afterwards, the auto-mute control circuit 100 will respectively record the values of the rough tune digital signal RB and the fine tune digital signal FB, end the DC level calibration work, set the upper-bound voltage and the lower-bound voltage, and then enter the "auto-mute detecting mode."

In the following description is instruction for the "DC level calibration mode," which is another part of the DC level adjusting mechanism.

If the initial comparison signal CMPO is the digital logic of "one" (when the electronic system just enters the state of starting up), which means that if the DC level adjusting circuit 130 determines that the sensing DC level of the sensing voltage signal VSEN is higher than the common-mode voltage VCM according to the comparison signal CMPO, and then the DC level adjusting circuit 130 sets the total bit values of the fine tune digital signal FB as "one" and outputs the Up-Down digital signal UD of the low level voltage to the analog amplifier 110 to decrease the sensing DC level of the sensing voltage signal VSEN. It is worth mentioning that an effect of setting the total bit values of the fine tune digital signal FB from the digital logic of "zero" to "one" is equivalent to increase the LSB of the rough tune digital signal RB. Afterwards, according to the comparison signal CMPO, again, the DC level adjusting circuit 130 determines if there is the first cross point generated between the sensing DC level of the sensing voltage signal VSEN and the common-mode voltage VCM; which is to determine if the sensing DC level of the sensing voltage signal VSEN becomes lower than the common-mode voltage VCM from being higher than the common-mode voltage VCM.

If there is the first cross point generated between the sensing DC level of the sensing voltage signal VSEN and the common-mode voltage VCM; which means the sensing DC level of the sensing voltage signal VSEN becomes lower than the common-mode voltage VCM from being higher than the common-mode voltage VCM, and thus the DC level adjusting circuit 130 gradually decreases the LSB of the fine tune digital signal FB, and transmits the fine tune digital signal FB to the analog amplifier 110 to gradually adjusts (it is to raise here) the sensing DC level of the sensing voltage signal VSEN. During a process of gradually raising the sensing DC level of the sensing voltage signal VSEN, the DC level adjusting circuit 130 determines if the total bit values of the fine tune digital signal FB are "zero."

During the process of continuously gradually raising the sensing DC level of the sensing voltage signal VSEN, when the DC level adjusting circuit 130 determines the total bit values of the fine tune digital signal FB are "zero"; which means that the sensing DC level of the sensing voltage signal VSEN is getting very close to the common-mode voltage VCM, and thus the auto-mute control circuit 100 ends the DC level calibration work, sets the upper-bound voltage and the lower-bound voltage, and enters the "auto-mute detecting mode." On the other hand, during the process of continuously gradually raising the sensing DC level of the sensing voltage signal VSEN, when the DC level adjusting circuit 130 determines the total bit values of the fine tune digital signal FB are not "zero", and then the DC level adjusting circuit 130 further determines whether there is the second cross point generated between the sensing DC level of the sensing voltage signal VSEN and the common-mode voltage VCM; which is to determine if the sensing DC level of the sensing voltage signal VSEN becomes higher than the common-mode voltage VCM again.

If the DC level adjusting circuit 130 determines that there is the second cross point generated between the sensing DC level of the sensing voltage signal VSEN and the common-mode voltage VCM; which means that the sensing DC level of the sensing voltage signal VSEN becomes higher than the common-mode voltage VCM again, and which indicates that the sensing DC level of the sensing voltage signal VSEN is getting very close to the common-mode voltage VCM, and the auto-mute control circuit 100 will respectively record values of the rough tune digital signal RB and the fine tune digital signal FB, end the DC level calibration work, set the upper-bound voltage and the lower-bound voltage, and then enter the "auto-mute detecting mode."

On the other hand, when the total bit values of the fine tune digital signal FB are set from the digital logic "zero" to the digital logic "one," if the sensing voltage signal VSEN is still higher than the common-mode voltage VCM, and then it shows that the first cross point between the sensing DC level of the sensing voltage signal VSEN and the common-mode voltage VCM has not been generated, and thus the DC level adjusting circuit 130 gradually increase the LSB of the rough tune digital signal RB, and transmits the rough tune digital signal RB to the analog amplifier 110 to gradually adjusts (it is to reduce here) the sensing DC level of the sensing voltage signal VSEN. During a process of gradually reducing the sensing DC level of the sensing voltage signal VSEN, the DC level adjusting circuit 130 determines if the total bit values of the rough tune digital signal RB are "one."

During a process of gradually raising the sensing DC level of the sensing voltage signal VSEN, if the DC level adjusting circuit 130 determines if the total bit values of the rough tune digital signal RB are "one," and then it shows that there has not been any cross point generated between the sensing DC level of the sensing voltage signal VSEN and the common-mode voltage VCM, and which means the offset between the sensing DC level of the sensing voltage signal VSEN and the common-mode voltage is too much. At the moment, the auto-mute control circuit 100 ends the DC level calibration work, sets the upper-bound voltage and the lower-bound voltage, and enters the "auto-mute detecting mode."

During a process of through gradually increasing the LSB of the rough tune digital signal RB to raise the sensing DC level of the sensing voltage signal VSEN and generates the first cross point; which means that the sensing DC level of the sensing voltage signal VSEN becomes lower than the common-mode voltage VCM from being higher than the common-mode voltage VCM, and thus the rough tune digital signal RB will be locked at the value of the moment, and then the DC level adjusting circuit 130 starts gradually decreases the LSB of the fine tune digital signal FB so that the sensing DC level of the sensing voltage signal VSEN is raised until being higher than the common-mode voltage VCM again; which means that the second cross point is generated. Afterwards, the auto-mute control circuit 100 will respectively record the values of the rough tune digital signal RB and the fine tune digital signal FB, end the DC level calibration work, set the upper-bound voltage and the lower-bound voltage, and then enter the "auto-mute detecting mode."

Figure 2:
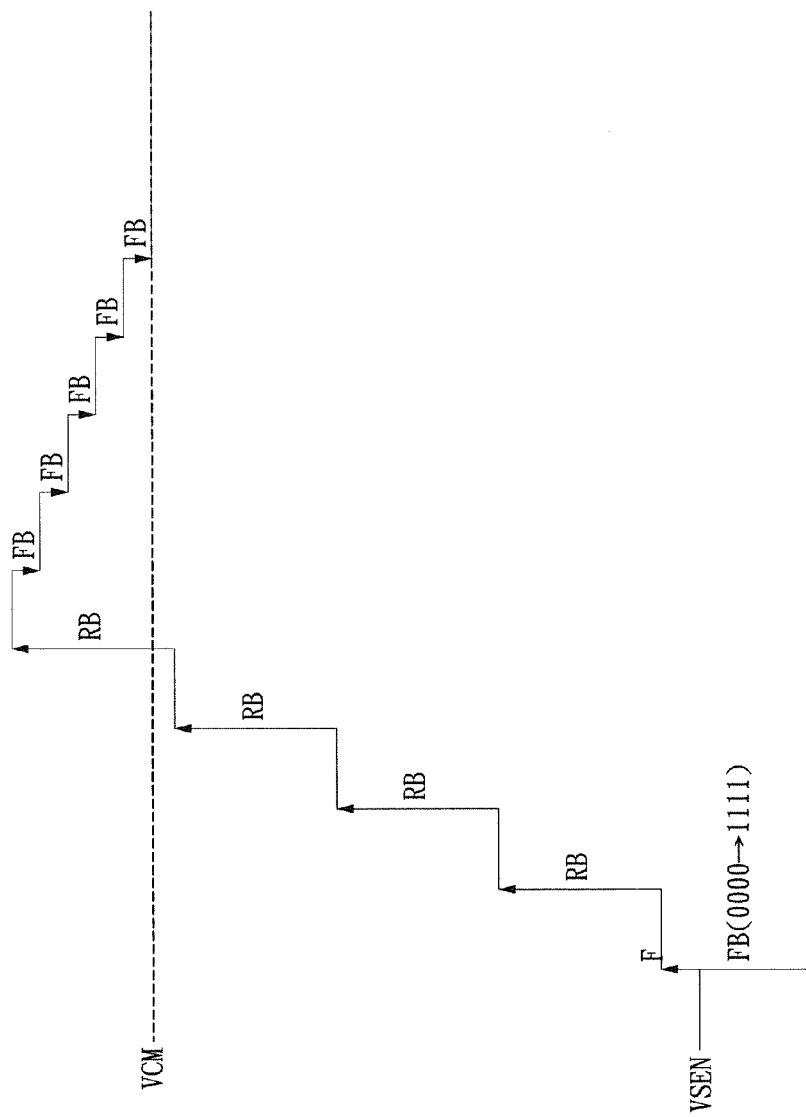
FIG. 2 shows a schematic diagram of a sensing DC level according to the embodiment of the instant disclosure.

At the moment, referring to FIGS. 1-2 at the same time, FIG. 2 shows a schematic diagram of a sensing DC level according to the embodiment of the instant disclosure. Taking the initial comparison signal CMPO of the digital logic of "zero" as an example: the detecting circuit 120 determines that the sensing DC level of the sensing voltage signal VSEN is lower than the common-mode voltage VCM, and transmits the comparison signal CMPO to the DC level adjusting circuit 130. Before further instruction, it is clarified that the fine tune digital signal FB and the rough tune digital signal RB in the embodiments are taken examples four bits, and it is not limited hereto.

When the DC level adjusting circuit 130 acquires that the sensing DC level of the sensing voltage signal VSEN is lower than the common-mode voltage VCM according to the comparison signal CMPO, the DC level adjusting circuit 130 first sets the total bit values of the fine tune digital signal FB as "one"; which means, the total bit values are set from "0000" to "1111," and outputs the Up-Down digital signal UD of the high level voltage to the analog amplifier 100 to raise the sensing DC level of the sensing voltage signal VSEN. Afterwards, the DC level adjusting circuit 130 determines if there is the first cross point generated between the sensing DC level of the sensing voltage signal VSEN and the common-mode voltage VCM according to the comparison signal CMPO.

Since the sensing DC level of the sensing voltage signal VSEN is still lower than the common-mode voltage VCM, the first cross point is not generated. The DC level adjusting circuit 130 gradually increase the LSB of the rough tune digital signal RB, and transmits the rough tune digital signal RB to the analog amplifier 110 to gradually adjusts (it is to raise here) the sensing DC level of the sensing voltage signal VSEN. During a process of gradually raising the sensing DC level of the sensing voltage signal VSEN, the DC level adjusting circuit 130 determines if the total bit values of the rough tune digital signal RB are "one." In the present embodiment, as shown in FIG. 2, after four times of rough tuning; which means, the rough tune digital signal raised in order from "0000, to "0001," to "0010," to "0011," and to "0100"; when the rough tune digital signal RB is "0100," there is the first cross point generated between the sensing DC level of the sensing voltage signal VSEN and the common-mode voltage VCM. In other words, after four times of rough tuning, the sensing DC level of the sensing voltage signal VSEN is higher than the common-mode voltage VCM.

Afterwards, since the total bit values of the rough tune digital signal RB have not been "one", and there is the first cross point generated, and thus the DC level adjusting circuit 130 starts gradually decreasing the LSB of the fine tune digital signal FB. Following an order as shown in FIG. 2, after five times of rough tuning; which means, the fine tune digital signal FB is tuned down in order from "1111, to "1110," to "1101," to "1100," to "1011," and to "1001"; when the fine tune digital signal FB is "1001," there is the second cross point generated between the sensing DC level of the sensing voltage signal VSEN and the common-mode voltage VCM. Since the total bit values of the rough tune digital signal RB have not been "zero", and there is the second cross point generated between the sensing DC level of the sensing voltage signal VSEN and the common-mode voltage VCM, and thus the auto-mute control circuit 100 will record values of the rough tune digital signal RB and the fine tune digital signal FB at the moment, end the DC level calibration work, set the upper-bound voltage and the lower-bound voltage, and then enter the "auto-mute detecting mode."

Accordingly, the auto-mute control circuit of the present embodiment is able to directly enter the "DC level calibration mode" after the system is started, and adjusts the sensing DC level of the sensing voltage signal to close to or equal to the common-mode voltage inside the system. Afterwards, the auto-mute control circuit enters the "auto-mute detecting mode"; which is to detect that if an amplitude swing of the sensing voltage signal VSEN is between upper-bound voltage and lower-bound voltage. After the signal of zero input showing up for a while, the auto-mute control circuit automatically starts the auto-mute function. Accordingly, the instant disclosure is able to automatically calibrate the sensing DC level so as to be close to or equal to the common-mode voltage VCM, and thus the electronic system having the auto-mute control circuit is able to reduce the noise automatically and raise a signal-to-noise ratio.

There is further instruction in the work mechanism regarding the auto-mute detecting mode of the auto-mute control circuit 100.

[Embodiment of an Auto-Mute Detecting Mode of an Auto-Mute Control Circuit]

Figure 3:
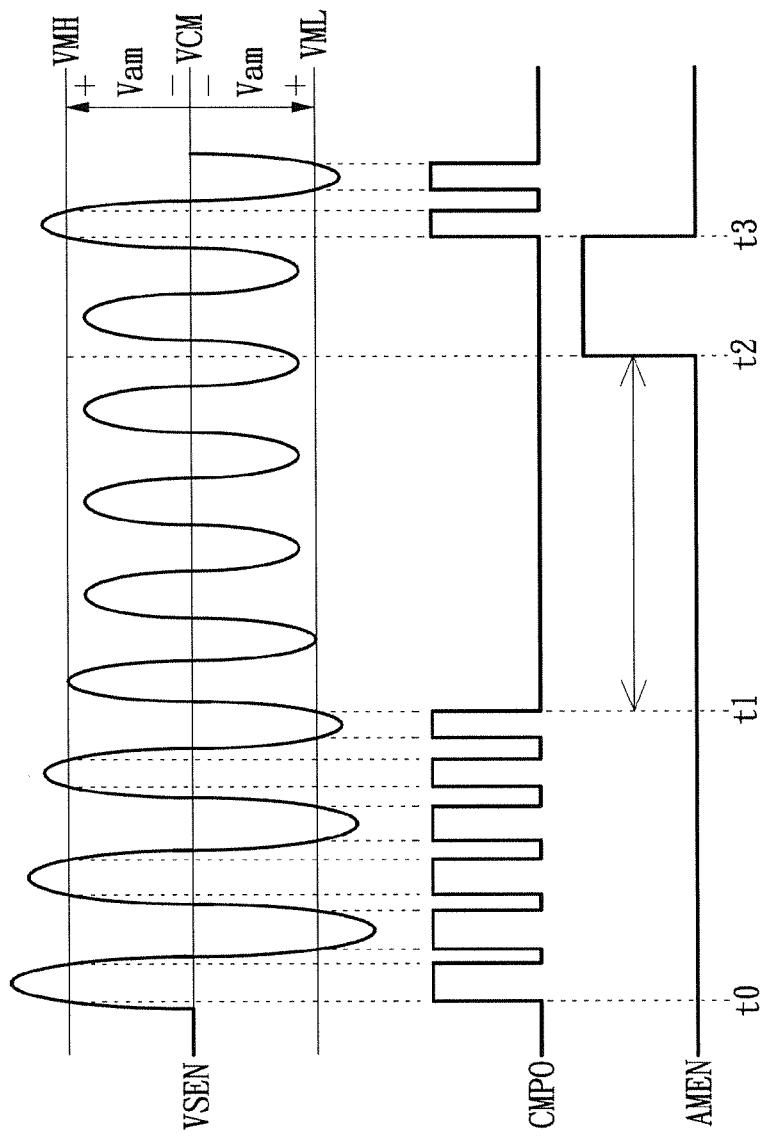
FIG. 3 shows a waveform diagram of an auto-mute detecting mode according to the embodiment of the instant disclosure.

Referring to FIGS. 1 and 3, FIG. 3 shows a waveform diagram of an auto-mute detecting mode according to the embodiment of the instant disclosure. When an auto-mute control circuit 100 ends a DC level calibration work and enters into an "auto-mute detecting mode" from the "DC level calibration mode," the auto-mute control circuit 100 detects an amplitude swing of a sensing voltage signal VSEN with an upper-bound voltage and a lower-bound voltage, wherein a detecting circuit 120 further receives an upper-bound voltage VMH and a lower-bound voltage VML. It is clarified that the upper-bound voltage VMH is a sum of a common-mode voltage VCM and an auto-mute reference voltage Vam; the lower-bound voltage VML is the common-mode voltage VCM minus the auto-mute reference voltage Vam, wherein a value of the auto-mute reference voltage Vam is adjustable, and may be further set by a user to determine real values of the upper-bound voltage VMH and the lower-bound voltage VML.

When the auto-mute control circuit 100 enters the "auto-mute detecting mode," a counter 140 receives the low level voltage (digital logic: "zero"), the counter 140 starts counting and when the counting reaches a predetermined counting value, the counter 140 outputs an auto-mute enabling signal AMEN of a high level voltage to a signal processing unit (not shown in FIG. 1) to shut a work of the signal processing unit. When the counter 140 receives the high level voltage (digital logic: "one"), the counter 140 will be reset.

As shown in FIG. 3, during the time of "t0" to "t1," when a detecting circuit 120 detects that the amplitude swing of the sensing voltage signal VSEN is over the upper-bound voltage VMH or lower than the lower-bound voltage VML, the detecting circuit 120 outputs a comparison signal CMPO and the comparison signal CMPO shows a switching waveform between high and low levels. At the moment, the counter 140 will be constantly reset (reset for six times), and the auto-mute enabling signal AMEN shows a waveform of a low level voltage.

During a time from "t1" to "t2," when the detecting circuit 120 detects that the amplitude swing of the sensing voltage signal VSEN is neither over the upper-bound voltage VMH nor lower than the lower-bound voltage VML; which means that the amplitude swing of the sensing voltage signal VSEN is between the upper-bound voltage VMH and the lower-bound voltage VML, the detecting circuit 120 outputs the comparison signal CMPO of a low level voltage to the counter 140. After the counter 140 receives the comparison signal CMPO of a low level voltage, the counter 140 starts counting. After the counting lasting for a while (such as from time "t1" to "t2"), at time "t2," the counter 140 outputs the auto-mute enabling signal AMEN of a high level voltage. It is worth mentioning that in the embodiment, the counter 140 counts a duration of time when the amplitude swing of the sensing voltage signal VSEN remains between the upper-bound voltage VMH and the lower-bound voltage VML.

After time "t3," when the detecting circuit 120 detects that the amplitude swing of the sensing voltage signal VSEN is over the upper-bound voltage VMH or lower than the lower-bound voltage VML, the detecting circuit 120 outputs a comparison signal CMPO and the comparison signal CMPO shows a switching waveform between high and low levels. At the moment, the counter 140 will be constantly reset (reset for two times), and the auto-mute enabling signal AMEN shows a waveform of a low level voltage.

There is at least an embodiment for further instruction to present a specific operation flow of the auto-mute control circuit 100 of the instant disclosure.

In the following embodiments, there are only parts different from embodiments in FIGS. 1-3 described, and the omitted parts are indicated to be identical to the embodiments in FIGS. 1-3. In addition, for an easy instruction, similar reference numbers or symbols refer to elements alike.

[Embodiment of an Electronic System with an Auto-Mute Control Circuit]

Figure 4:
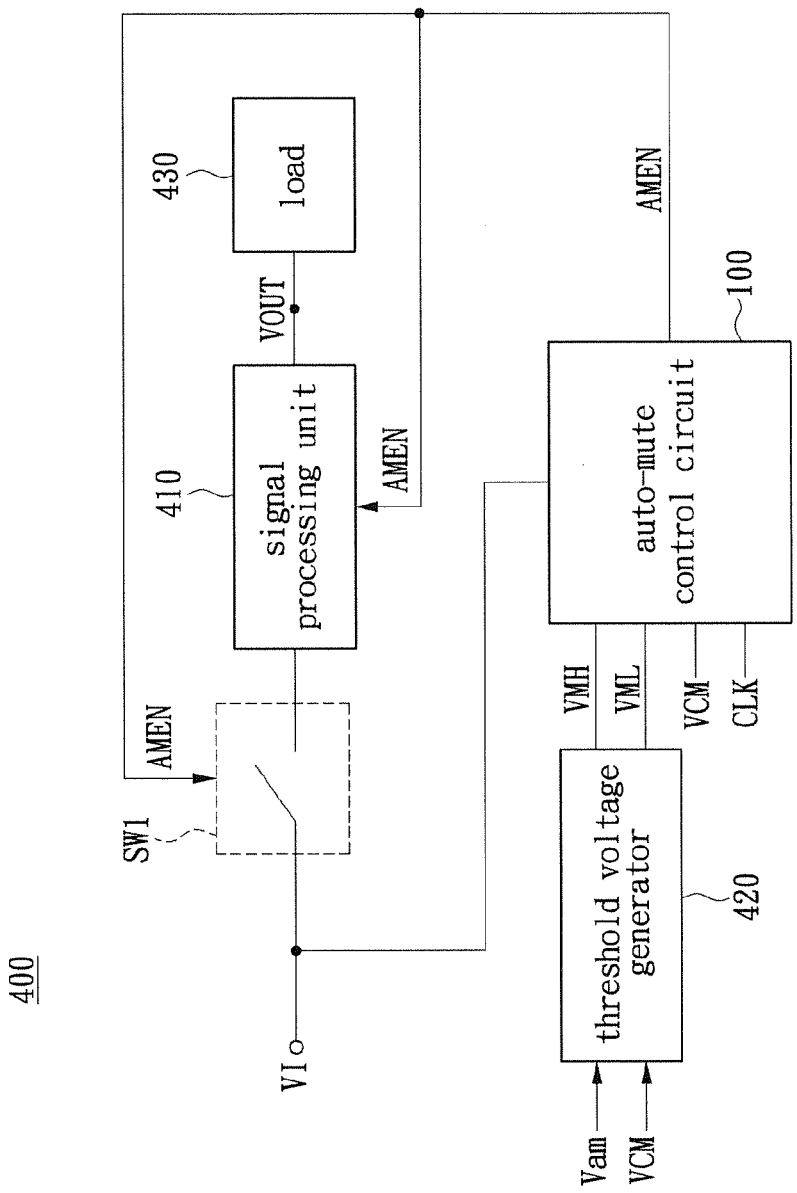
FIG. 4 shows a schematic diagram of an electronic system with an auto-mute control circuit according to the embodiment of the instant disclosure.

Referring to FIG. 4, FIG. 4 shows a schematic diagram of an electronic system 400 with an auto-mute control circuit according to the embodiment of the instant disclosure. The electronic system 400 includes an auto-mute control circuit 100, a first switch SW1, a signal processing unit 410, a threshold voltage generator 420, and a load 430. The signal processing unit 410 may be an operation amplifier, an analog-digital converter, a digital-analog converter, or other similar circuit blocks. The first switch SW1 may be a switch consisted of transistors, and in the present embodiment, the first switch SW1 is turned ON by a low voltage level, and thus the first switch SW1 may be embodied with a P-type transistor.

A terminal of the first switch SW1 is coupled to an input signal VI, and another terminal of the first switch SW1 is coupled to the signal processing unit 410. The signal processing unit 410 is coupled to the auto-mute control circuit 100. The threshold voltage generator 420 is coupled to the auto-mute control circuit 100. The load 430 is coupled to the signal processing unit 410.

In the following description, it is to further disclose an operation of the electronic system 400. Please refer to FIGS. 1 and 4 for further understanding of the instant disclosure if it is necessary.

When the electronic system 400 is started and receives the input signal VI, the electronic system 400 first enters a "DC level calibration mode"; which means that the auto-mute control circuit 100 first receives the input signal VI, and adjusts a sensing DC level of a sensing voltage signal VSEN close to or equal to a common-mode voltage VCM after the input signal VI amplified according to a DC level adjusting mechanism of the embodiment in FIG. 1. When the auto-mute control circuit 100 ends a DC level calibration work, the auto-mute control circuit 100 enters into an "auto-mute detecting mode" from the "DC level calibration mode."

Under the "auto-mute detecting mode," the threshold voltage generator 420 generates an upper-bound voltage VMH and a lower-bound voltage VML according to the common-mode voltage VCM received and an auto-mute reference voltage Vam, and the threshold voltage generator 420 transmits the upper-bound voltage VMH and the lower-bound voltage VML to the auto-mute control circuit 100. The auto-mute control circuit 100 detects and determines if an amplitude swing of the sensing voltage signal VSEN is over the upper-bound voltage VMH or is lower the lower-bound voltage VML.

If the amplitude swing of the sensing voltage signal VSEN is over the upper-bound voltage VMH or is lower the lower-bound voltage VML, which means that the input signal VI is large enough and is regarded as signal, not noise. Therefore, the auto-mute control circuit 100 outputs an auto-mute enabling signal AMEN of a low level voltage to the first switch SW1 to switch on the first switch SW1, and the auto-mute control circuit 100 outputs the auto-mute enabling signal AMEN of a low level voltage to the signal processing unit 410 to switch on the signal processing unit 410 so as to have the signal processing unit 410 work normally. On the other hand, if the amplitude swing of the sensing voltage signal VSEN is neither over the upper-bound voltage VMH nor lower the lower-bound voltage VML, and then it indicates that the input signal VI is too weak and seen as a zero-input signal, and thus there is a need for clearing the noise. Therefore, the auto-mute control circuit 100 outputs the auto-mute enabling signal AMEN of the high level voltage to the first switch SW1 to cut the first switch SW1 off, and the auto-mute control circuit 100 outputs the auto-mute enabling signal AMEN of the high level voltage to the signal processing unit 410 to shut the signal processing unit 410 so as to have the signal processing unit 410 stop working.

There is at least an embodiment for further instruction to present a specific operation flow of the electronic system 400 of the instant disclosure.

In the following embodiments, there are only parts different from embodiments in FIG. 4 described, and the omitted parts are indicated to be identical to the embodiments in FIG. 4. In addition, for an easy instruction, similar reference numbers or symbols refer to elements alike.

[Embodiment of an Electronic System with an Auto-Mute Control Circuit]

Figure 5:
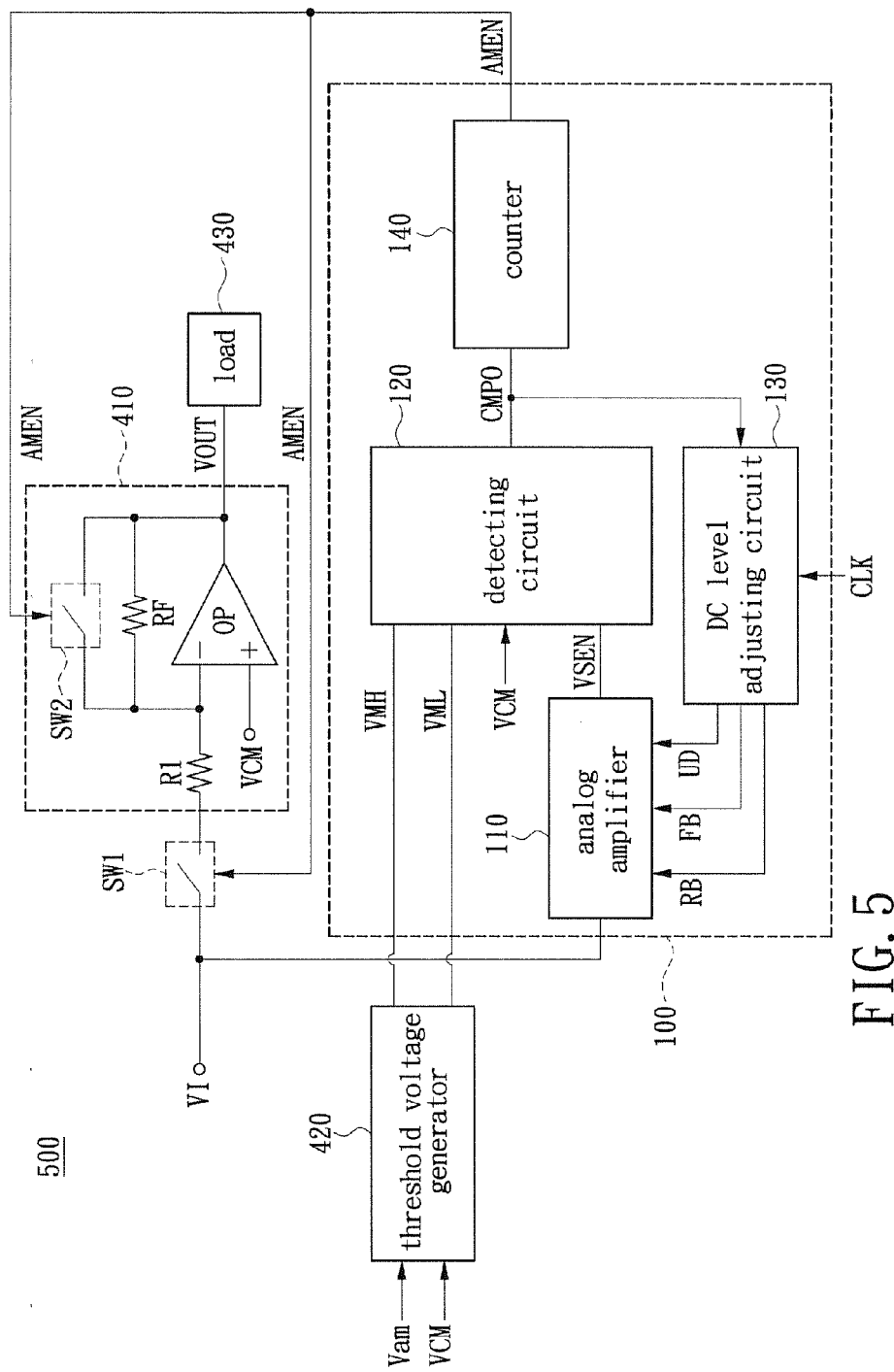
FIG. 5 shows a schematic diagram of an electronic system with an auto-mute control circuit according to an embodiment of the instant disclosure.

Referring to FIG. 5, FIG. 5 shows a schematic diagram of an electronic system 500 with an auto-mute control circuit according to an embodiment of the instant disclosure. Different from the embodiment in FIG. 4, in the embodiment, a signal processing unit 410 of the electronic system 500 includes a first resistor R1, an operation amplifier OP, a second resistor RF, and a second switch SW2. The second switch SW2 may be a switch consisted of transistors, and in the present embodiment, the second switch SW2 is turned ON by a high voltage level, and thus the second switch SW2 may be embodied with an N-type transistor.

A terminal of the first resistor R1 is coupled to another terminal of the first switch SW1. A negative input terminal of the operation amplifier OP is coupled to another terminal of the first resistor R1. A positive input terminal of the operation amplifier OP receives a common-mode voltage VCM. An output terminal of the operation amplifier OP outputs an output signal VOUT. A terminal of the second resistor RF is coupled to another terminal of the first resistor R1, and another terminal of the second resistor RF is coupled to the output terminal of the operation amplifier OP. The second switch SW2 is coupled to the second resistor RF in parallel, wherein the second switch SW2 receives an auto-mute enabling signal AMEN and accordingly determines the second switch SW2 to be switched on or off.

There is further instruction in describing a relevant operation of the electronic system 500.

When the electronic system 500 is started and receives an input signal VI, the electronic system 500 first enters a "DC level calibration mode"; which means that the auto-mute control circuit 100 first receives the input signal VI, and adjusts a sensing DC level of a sensing voltage signal VSEN close to or equal to a common-mode voltage VCM after the input signal VI amplified according to a DC level adjusting mechanism of the embodiment in FIG. 1. When the auto-mute control circuit 100 ends a DC level calibration work, the auto-mute control circuit 100 enters into an "auto-mute detecting mode" from the "DC level calibration mode."

Under the "auto-mute detecting mode," the threshold voltage generator 420 generates an upper-bound voltage VMH and a lower-bound voltage VML according to the common-mode voltage VCM received and an auto-mute reference voltage Vam, and the threshold voltage generator 420 transmits the upper-bound voltage VMH and the lower-bound voltage VML to the auto-mute control circuit 100. The auto-mute control circuit 100 detects and determines if an amplitude swing of the sensing voltage signal VSEN is over the upper-bound voltage VMH or is lower the lower-bound voltage VML.

If the amplitude swing of the sensing voltage signal VSEN is over the upper-bound voltage VMH or is lower the lower-bound voltage VML, which means that the input signal VI is large enough and is regarded as signal, not noise. Therefore, the auto-mute control circuit 100 outputs an auto-mute enabling signal AMEN of a low level voltage to the first switch SW1 to switched on the first switch SW1, and the auto-mute control circuit 100 outputs the auto-mute enabling signal AMEN of a low level voltage to the second switch SW2 to switch off the first switch SW2, and thereby to have the operation amplifier OP work normally. Accordingly, the operation amplifier OP having a configuration of an inverting negative-feedback receives the input signal VI, and outputs an output signal VOUT to the load 430, wherein there is a gain of "−RF/R1."

On the other hand, if the amplitude swing of the sensing voltage signal VSEN is neither over the upper-bound voltage VMH nor lower the lower-bound voltage VML, and then it indicates that the input signal VI is too weak and seen as a zero-input signal, and thus there is a need for clearing the noise. Therefore, the auto-mute control circuit 100 outputs the auto-mute enabling signal AMEN of the high level voltage to the first switch SW1 to switch off the first switch SW1, and the auto-mute control circuit 100 outputs the auto-mute enabling signal AMEN of the high level voltage to the signal processing unit 410 to shut the signal processing unit 410 so as to have the signal processing unit 410 stop working.

[Embodiment of an Auto-Mute Control Method]

Figures 1, 6A:
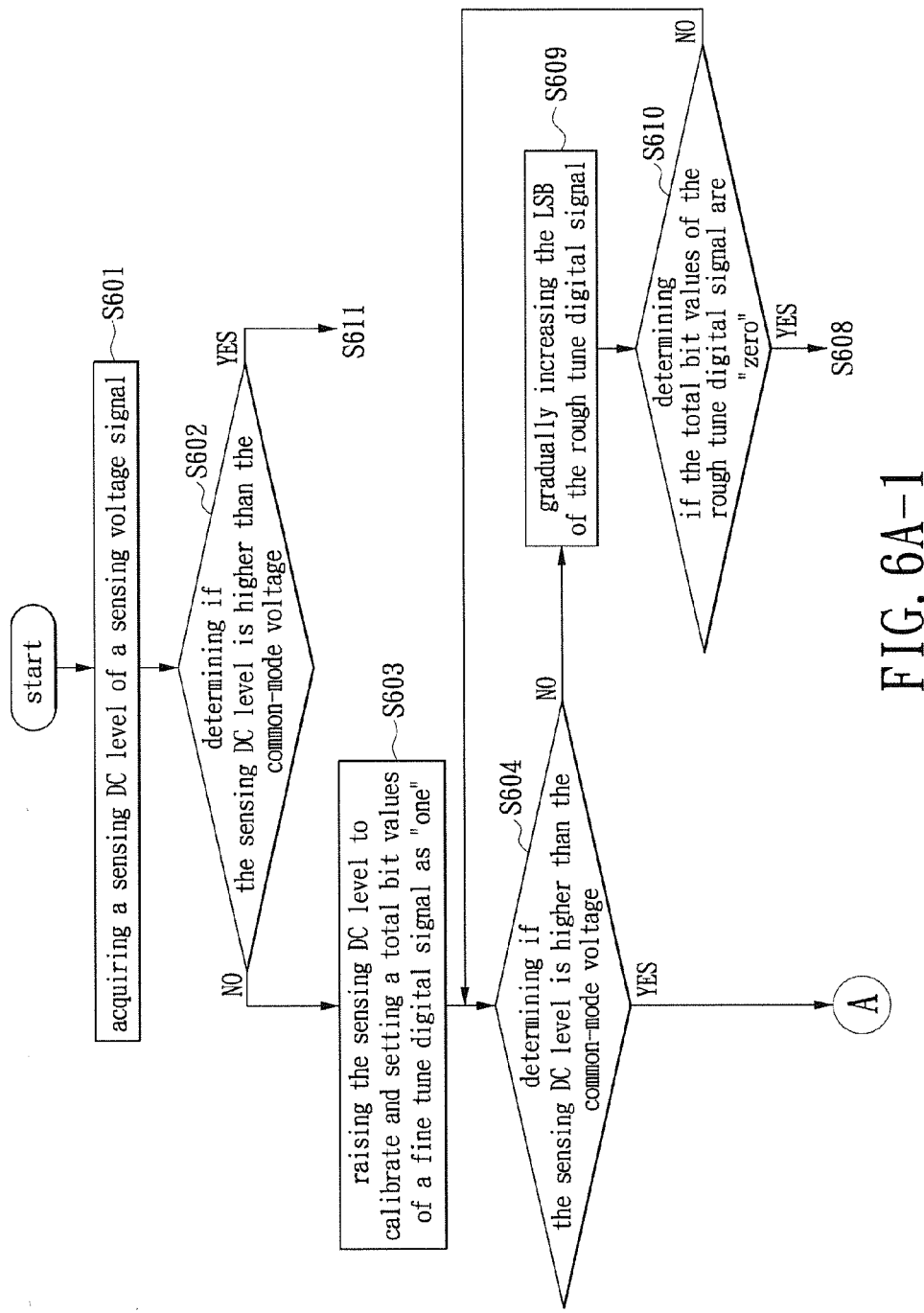
Figures 2, 6A:
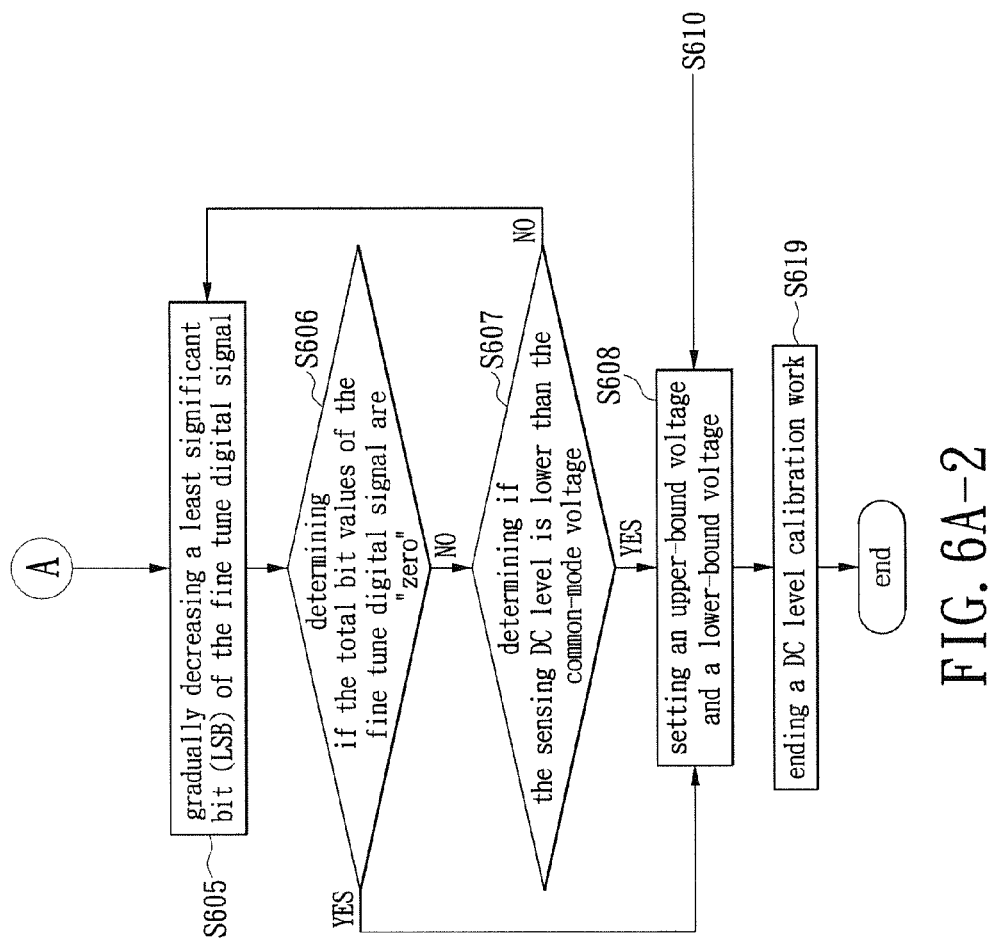
Figure 6B:
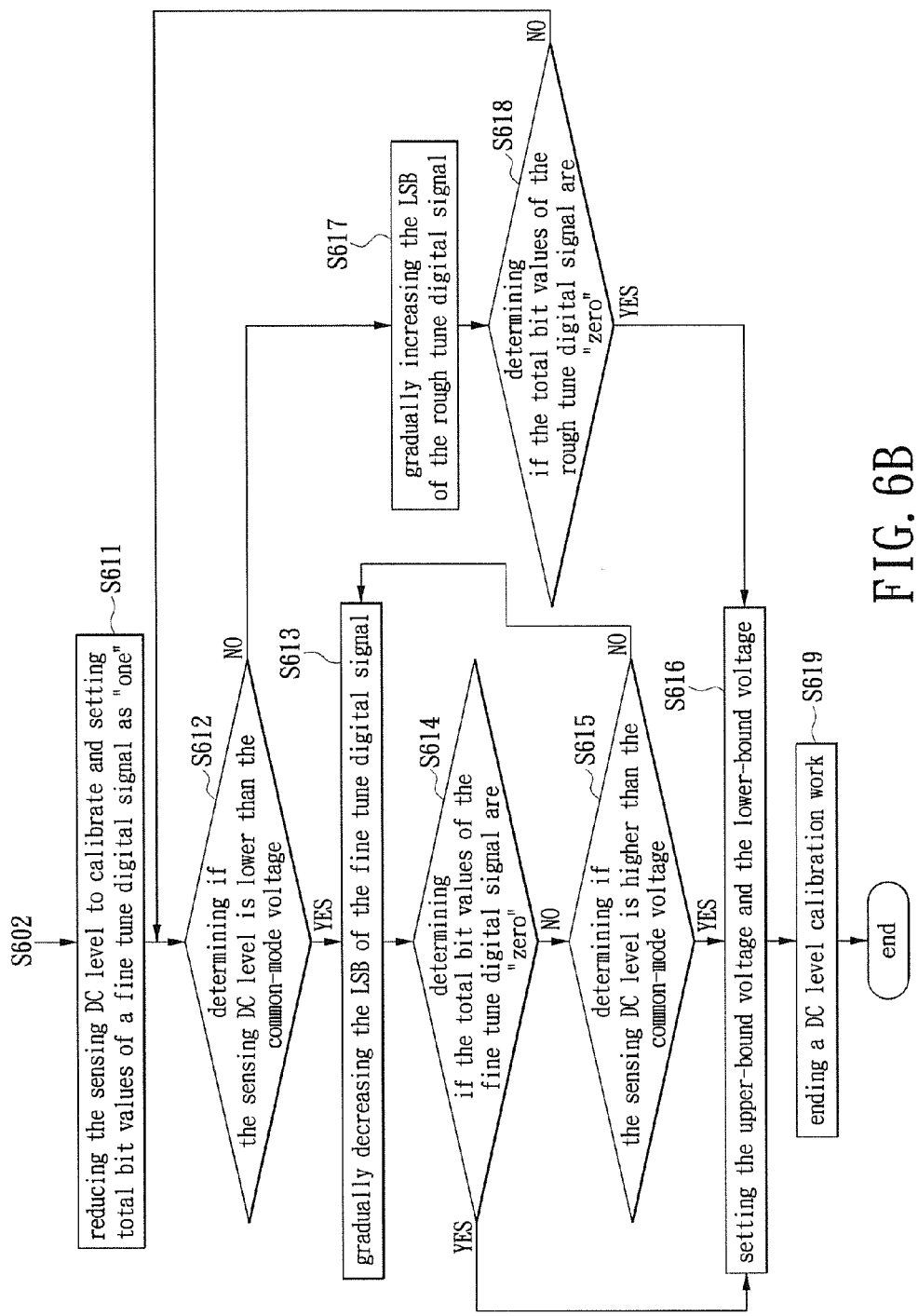

Referring to FIGS. 6A-1、6A-2 and 6B, FIGS. 6A-1、6A-2 and 6B show a flow chart of an auto-mute control method according to the embodiment of the instant disclosure. Steps of explanatory flow of the present embodiment may be embodied with an auto-mute control circuit in FIG. 1, and thus please refer to FIG. 1 for further understanding. Steps of the auto-mute control method includes: acquiring a sensing DC level of a sensing voltage signal (S601); determining if the sensing DC level is higher than the common-mode voltage (S602); raising the sensing DC level to calibrate and setting a total bit values of a fine tune digital signal as "one" (S603); determining if the sensing DC level is higher than the common-mode voltage (S604); gradually decreasing a least significant bit (LSB) of the fine tune digital signal (S605); determining if the total bit values of the fine tune digital signal are "zero" (S606); determining if the sensing DC level is lower than the common-mode voltage (S607); setting an upper-bound voltage and a lower-bound voltage (S608); gradually increasing the LSB of the rough tune digital signal (S609); determining if the total bit values of the rough tune digital signal are "zero" (S610); reducing the sensing DC level to calibrate and setting a total bit values of a fine tune digital signal as "one" (S611); determining if the sensing DC level is lower than the common-mode voltage (S612); gradually decreasing the LSB of the fine tune digital signal (S613); determining if the total bit values of the fine tune digital signal are "zero" (S614); determining if the sensing DC level is higher than the common-mode voltage (S615); setting the upper-bound voltage and the lower-bound voltage (S616); gradually increasing the LSB of the rough tune digital signal (S617); determining if the total bit values of the rough tune digital signal are "zero" (S618); ending a DC level calibration work (S619).

In step S601, the auto-mute control circuit 100 acquires the sensing DC level of the sensing voltage signal VSEN through the analog amplifier 110 and the detecting circuit 120. Next, a process proceeds to step S602.

In step S602, the detecting circuit 120 compares the sensing DC level of the sensing voltage signal VSEN with the common-mode voltage VCM, and the detecting circuit 120 transmits a comparison signal CMPO to the DC level adjusting circuit 130, according to a comparing result. If the sensing DC level is lower than the common-mode voltage VCM, then the process proceeds to step S603; if the sensing DC level is higher than the common-mode voltage VCM, then the process proceeds to step S611.

In step S603, according to the comparison signal CMPO, the DC level adjusting circuit 130 determines to raise the sensing DC level to calibrate and set a total bit values of a fine tune digital signal as "one," wherein an initial value of the fine tune digital signal FB is "one." Next, the process proceeds to step S604.

In step S604, the DC level adjusting circuit 130 determines if there is a first cross point generated; which means that the DC level adjusting circuit 130 determines if the sensing DC level of the sensing voltage signal VSEN is higher than the common-mode voltage VCM. If the sensing DC level of the sensing voltage signal VSEN is higher than the common-mode voltage VCM, then the first cross point is generated and the process proceeds to step S605. If the sensing DC level of the sensing voltage signal VSEN is lower than the common-mode voltage VCM, then the first cross point has not been generated and the process proceeds to step S609.

In step S605, the DC level adjusting circuit 130 gradually decrease the LSB of the fine tune digital signal FB, and after each time of decreasing the LSB of the fine tune digital signal FB, the DC level adjusting circuit 130 transmits the fine tune digital signal FB to the analog amplifier 110 to decrease the sensing DC level of the sensing voltage signal VSEN, and the process proceeds to step S606.

In step S606, the DC level adjusting circuit 130 determines if the total bit values of the fine tune digital signal FB are "zero," which is to determine if the total bit values of the fine tune digital signal FB is adjusted from "one" to "zero." If the total bit values of the fine tune digital signal FB have been "zero," then the process proceeds to step S608. If the total bit values of the fine tune digital signal FB have not been "zero," then the process proceeds to step S607.

In step S607, the DC level adjusting circuit 130 determines if there is a second cross point generated; which means that the DC level adjusting circuit 130 determines if the sensing DC level of the sensing voltage signal VSEN is lower than the common-mode voltage VCM. If the sensing DC level of the sensing voltage signal VSEN is lower than the common-mode voltage VCM, then the process proceeds to step S608. If the sensing DC level of the sensing voltage signal VSEN is still higher than the common-mode voltage VCM, then the process is back to step S605.

In step S608, the auto-mute control circuit 100 sets the upper-bound voltage VMH and the lower-bound voltage VML, wherein the upper-bound voltage VMH is a sum of the common-mode voltage VCM and an auto-mute reference voltage Vam; the lower-bound voltage VML is the common-mode voltage VCM minus the auto-mute reference voltage Vam. Next, the process proceeds to step S619.

When the process proceeds from step S604 to S609, the DC level adjusting circuit 130 gradually increase the LSB of the rough tune digital signal RB, and after each time of increasing the LSB of the rough tune digital signal RB, the DC level adjusting circuit 130 transmits the rough tune digital signal RB to the analog amplifier 110 to increase the sensing DC level of the sensing voltage signal VSEN, and the process proceeds to step S610.

In step S610, the DC level adjusting circuit 130 determines if the total bit values of the rough tune digital signal RB are "one," which is to determine if the total bit values of the rough tune digital signal RB are increased from "zero" to "one." If the total bit values of the rough tune digital signal RB have been "one," then the process proceeds to step S608. If the total bit values of the rough tune digital signal RB have not been "one," then the process is back to step S604 to determine if there is the first cross point generated.

In step S611, the DC level adjusting circuit 130 determines to decrease the sensing DC level of the sensing voltage signal VSEN to calibrate according to the comparison signal CMPO, and sets the total bit values of the fine tune digital signal FB as "one." Next, the process proceeds to step S612.

In step S612, the DC level adjusting circuit 130 determines if there is the first cross point generated; which means that the DC level adjusting circuit 130 determines if the sensing DC level of the sensing voltage signal VSEN is lower than the common-mode voltage VCM. If the sensing DC level of the sensing voltage signal VSEN is lower than the common-mode voltage VCM, then the first cross point is generated and the process proceeds to step S613. If the sensing DC level of the sensing voltage signal VSEN is higher than the common-mode voltage VCM, then the first cross point has not been generated and the process proceeds to step S617.

In step S613, the DC level adjusting circuit 130 gradually decreases the LSB of the fine tune digital signal FB, and after each time of decreasing the LSB of the fine tune digital signal FB, the DC level adjusting circuit 130 transmits the fine tune digital signal FB to the analog amplifier 110 to raise up the sensing DC level of the sensing voltage signal VSEN, and the process proceeds to step S614.

In step S614, the DC level adjusting circuit 130 determines if the total bit values of the fine tune digital signal FB are "zero," which means that the DC level adjusting circuit 130 determines if the total bit values of the fine tune digital signal FB are adjusted from "one" to "zero." If the total bit values of the fine tune digital signal FB have been "zero," then the process proceeds to step S616. If the total bit values of the fine tune digital signal FB have not been "zero," then the process proceeds to step S615.

In step S615, the DC level adjusting circuit 130 determines if there is a second cross point generated; which means that the DC level adjusting circuit 130 determines if the sensing DC level of the sensing voltage signal VSEN is higher than the common-mode voltage VCM. If the sensing DC level of the sensing voltage signal VSEN is higher than the common-mode voltage VCM, then the process proceeds to step S616. If the sensing DC level of the sensing voltage signal VSEN is still lower than the common-mode voltage VCM, then the process is back to step S613.

In step S616, the auto-mute control circuit 100 sets the upper-bound voltage VMH and the lower-bound voltage VML, wherein the upper-bound voltage VMH is a sum of the common-mode voltage VCM and an auto-mute reference voltage Vam; the lower-bound voltage VML is the common-mode voltage VCM minus the auto-mute reference voltage Vam. Next, the process proceeds to step S619. In addition, an operation executed in step S616 is identical of the operation executed in S608.

When the process proceeds from step S612 to step S617, the DC level adjusting circuit 130 gradually increases the LSB of the rough tune digital signal RB, and after each time of tuning up the LSB of the rough tune digital signal RB, the DC level adjusting circuit 130 transmits the rough tune digital signal RB to the analog amplifier 110 to reduce the sensing DC level of the sensing voltage signal VSEN, and the process proceeds to step S618.

In step S618, the DC level adjusting circuit 130 determines if the total bit values of the rough tune digital signal RB are "one," which is to determine if the total bit values of the rough tune digital signal RB are increased from "zero" to "one." If the total bit values of the rough tune digital signal RB have been "one," then the process proceeds to step S616. If the total bit values of the rough tune digital signal RB have not been "one," then the process is back to step S612 to determine if there is the first cross point generated.

In step S619, the auto-mute control circuit 100 ends the DC level calibration work, and enters into "the auto-mute detecting mode" from the "DC level calibration mode."

Relevant details of the steps of auto-mute control method regarding the auto-mute control circuit 100 are described in the embodiments of FIGS. 1-3, and thus it is not repeated thereto. It is clarified that, a sequence of steps in FIGS. 6A-1、6A-2 and 6B are set for a need to instruct easily, and thus the sequence of the steps is not used as a condition in demonstrating the embodiments of the instant disclosure.

To sum up, the electronic system, the auto-mute control circuit and the control method thereof in the embodiments of the instant disclosure are able to adjust the sensing DC level of the sensing voltage signal to be close to or equal to the common-mode voltage. Afterwards, the auto-mute control circuit enters the "auto-mute detecting mode," in which is to detect if the amplitude swing of the sensing voltage signal between the upper-bound voltage and the lower-bound voltage. After a signal of zero input showing up for a while, the auto-mute control circuit automatically starts an auto-mute function. Accordingly, the instant disclosure is able to automatically calibrate the sensing DC level to have the sensing DC level be close to or equal to the common-mode voltage, and further allows a noise to be reduced when there is zero input and a signal-to-noise ratio to be raised for the electronic system with the auto-mute control circuit.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. An auto-mute control circuit, comprising:
   an analog amplifier, receiving an input signal and outputting a sensing voltage signal accordingly;
   a detecting circuit, coupled to the analog amplifier, wherein the detecting circuit compares a common-mode voltage received with the sensing voltage signal received and outputs a comparison signal according to a comparing result; and
   a direct-current (DC) level adjusting circuit, receiving the comparison signal and accordingly outputting an Up-Down digital signal, a fine tune digital signal and a rough tune digital signal to the analog amplifier to adjust a sensing DC level of the sensing voltage signal, so that the sensing DC level is close to or equal to the common-mode voltage, wherein initial values of the fine tune digital signal and the rough tune digital signal are both "zero";
   wherein when the sensing DC level unadjusted is lower than the common-mode voltage, the DC level adjusting circuit sets total bit values of the fine tune digital signal as "one" and outputs the Up-Down digital signal of a high level voltage to the analog amplifier to increase the sensing DC level; when the sensing DC level unadjusted is higher than the common-mode voltage, the DC level adjusting circuit sets the total bit values of the fine tune digital signal as "one" and outputs the Up-Down digital signal of a low level voltage to the analog amplifier to decrease the sensing DC level.

2. The auto-mute control circuit according to claim 1, wherein after setting the total bit values of the fine tune digital signal as "one," if there is a first cross point generated between the sensing DC level and the common-mode voltage, the DC level adjusting circuit transmits the fine tune digital signal to the analog amplifier to slightly adjust the sensing DC level gradually; if the first cross point has not been generated between the sensing DC level and the common-mode voltage, then the DC level adjusting circuit transmits the rough tune digital signal to the analog amplifier to roughly adjust the sensing DC level gradually.

3. The auto-mute control circuit according to claim 2, wherein a least significant bit (LSB) of the fine tune digital signal whose total bit values are "one" is gradually decreased to adjust the sensing DC level, and the LSB of the rough tune digital signal whose total bit values are "zero" is gradually increased to adjust the sensing DC level.

4. The auto-mute control circuit according to claim 3, wherein during a gradually adjusting process, the DC level adjusting circuit determines if the total bit values of the fine tune digital signal are "zero"; if the total bit values of the fine tune digital signal have all been "zero," then the DC level adjusting circuit ends a DC level calibration work.

5. The auto-mute control circuit according to claim 4, wherein if the total bit values of the fine tune digital signal have not been "zero", then the DC level adjusting circuit determines if there is a second cross point generated, and if the DC level adjusting circuit determines that there is the second cross point generated between the sensing DC level and the common-mode voltage, then the DC level adjusting circuit ends the DC level calibration work.

6. The auto-mute control circuit according to claim 3, wherein during the process of roughly adjusting the sensing DC level, the DC level adjusting circuit determines if the total bit values of the rough tune digital signal are "one"; if the total bit values of the rough tune digital signal are "one," then the DC level adjusting circuit ends the DC level calibration work.

7. The auto-mute control circuit according to claim 6, wherein if the total bit values of the rough tune digital signal have not been "one," then the DC level adjusting circuit determines if there is the first cross point generated between the sensing DC level and the common-mode voltage.

8. The auto-mute control circuit according to claim 1, further comprising:
   a counter, coupled to the detecting circuit, and the counter receiving the comparison signal and accordingly outputting the auto-mute enabling signal to a first switch and a signal processing unit, wherein when the comparison signal is a low level voltage, the counter starts counting, and when the comparison signal is a high level voltage, the counter will be reset,
   wherein when the counter counts until a predetermined value, the auto-mute enabling signal of a high level voltage is outputted to cut off the first switch and switch off the signal processing unit.

9. The auto-mute control circuit according to claim 8, wherein when an amplitude swing of the sensing voltage signal is between an upper-bound voltage and a lower-bound voltage, the detecting circuit outputs the comparison signal of a low level voltage, wherein the upper-bound voltage is a sum of the common-mode voltage and an auto-mute reference voltage; the lower-bound voltage is the common-mode voltage minus the auto-mute reference voltage.

10. An electronic system, comprising:
an auto-mute control circuit according to claim 1;
a first switch, having a terminal receiving an auto-mute enabling signal and accordingly determining to be switched on or off;
a signal processing unit, coupled to another terminal of the first switch and the auto-mute control circuit, and the signal processing unit receiving the auto-mute enabling signal and accordingly determining to be switched on or off;
a threshold voltage generator, coupled to the auto-mute control circuit, wherein threshold voltage generator receives the common-mode voltage and the auto-mute reference voltage, and accordingly generates and transmits the upper-bound voltage and the lower-bound voltage to the auto-mute control circuit; and
a load, coupled to the signal processing unit, the load receiving the output signal transmitted from the signal processing unit.

11. The electronic system according to claim 10, wherein the signal processing unit further comprising:
a first resistor, having a terminal coupled to another terminal of the first switch;
an operation amplifier, having a negative input terminal coupled to another terminal of the first resistor, and a positive input terminal receiving the common-mode voltage, and an output terminal outputting an output signal;
a second resistor, having a terminal coupled to another terminal of the first resistor, and a second terminal coupled to the output terminal of the operation amplifier; and
a second switch, coupled to the second resistor in parallel, wherein the second switch receives the auto-mute enabling signal and accordingly determines to be switched on or off,
wherein states of being switched on or off for the first switch and the second switch are opposite.

12. An auto-mute control method, comprising:
acquiring a sensing DC level of a sensing voltage signal;
determining if the sensing DC level is higher than the common-mode voltage;
calibrating the sensing DC level and setting total bit values of a fine tune digital signal as "one" if the sensing DC level is higher or lower than the common-mode voltage;
determining if there is a first cross point generated;
decreasing the fine tune digital signal gradually if there is the first cross point generated;
determining if the total bit values of the fine tune digital signal are "zero";
determining if there is a second cross point generated if the total bit values have not been "zero";
setting an upper-bound voltage and a lower-bound voltage if there is the second cross point generated; and
ending a DC level calibration work,
wherein the auto-mute control method is used for the auto-mute control circuit according to claim 1 or the electronic system according to claim 10.

13. The auto-mute control method according to claim 12, wherein after a step of determining if there is a first cross point generated, comprising:
increasing the rough tune digital signal gradually if the first cross point has not been generated;
determining if the total bit values of the rough tune digital signal are "one";
setting the upper-bound voltage and the lower-bound voltage if the total bit values are "one"; and
going back to the step of determining if there is a first cross point generated if the total bit values are still not "one."

14. The auto-mute control method according to claim 12, wherein after a step of determining if the total bit values of the fine tune digital signal are "zero," comprising:
setting the upper-bound voltage and the lower-bound voltage if the total bit values are "zero"; and
ending the DC level calibration work.

15. The auto-mute control method according to claim 12, wherein after a step of determining if there is a second cross point generated, comprising:
going back to the step of decreasing the fine tune digital signal if the second cross point is still not generated.

* * * * *